(12) United States Patent
Chen

(10) Patent No.: US 7,576,602 B2
(45) Date of Patent: Aug. 18, 2009

(54) CIRCUIT UTILIZING OP-SHARING TECHNIQUE AND RELATED METHOD THEREOF

(75) Inventor: Cheng-Jui Chen, Tao-Yuan Hsien (TW)

(73) Assignee: Realtak Semiconductor Corp., HsinChu (TW)

(*) Notice: Subject to any disclaimer, the term of this patent is extended or adjusted under 35 U.S.C. 154(b) by 125 days.

(21) Appl. No.: 11/626,383

(22) Filed: Jan. 24, 2007

(65) Prior Publication Data
US 2007/0170982 A1 Jul. 26, 2007

(30) Foreign Application Priority Data
Jan. 24, 2006 (TW) ............... 95102700 A

(51) Int. Cl.
*H03F 1/02* (2006.01)
(52) U.S. Cl. .......................................... 330/9
(58) Field of Classification Search ............ 330/9; 327/124, 307
See application file for complete search history.

(56) References Cited

U.S. PATENT DOCUMENTS

| | | | |
|---|---|---|---|
| 6,292,052 B1* | 9/2001 | Carlson | 330/9 |
| 6,381,212 B1 | 4/2002 | Larkin | |
| 6,657,665 B1 | 12/2003 | Guidash | |
| 6,859,643 B1 | 2/2005 | Ma | |
| 6,946,987 B1 | 9/2005 | Van Blerkom | |
| 6,954,169 B1 | 10/2005 | Min | |
| 2003/0146786 A1* | 8/2003 | Gulati et al. | 330/9 |

FOREIGN PATENT DOCUMENTS

TW 457815 10/2001

\* cited by examiner

*Primary Examiner*—Robert Pascal
*Assistant Examiner*—Khiem D Nguyen
(74) *Attorney, Agent, or Firm*—Winston Hsu

(57) ABSTRACT

The present invention provides a circuit that utilizes OP-sharing technique. The circuit includes an amplifier, a first application circuit, a second application circuit, and a reset circuit. The first application circuit drives the amplifier during at least a first working period. The second application circuit drives the amplifier during at least a second working period. The reset circuit resets the amplifier during at least a third working period. The third working period is between the first working period and the second working period.

16 Claims, 2 Drawing Sheets

US 7,576,602 B2

CIRCUIT UTILIZING OP-SHARING TECHNIQUE AND RELATED METHOD THEREOF

BACKGROUND OF THE INVENTION

1. Field of the Invention

The present disclosure relates to circuits utilizing op-sharing technique, and more particularly, to circuits utilizing op-sharing technique with a reset circuit arranged in the output of an amplifier and related methods thereof.

2. Description of the Prior Art

Amplifier is widely applied in a variety of applications. Sometimes, a single amplifier is merely connected to an application circuit so that the application can drive the amplifier to perform functions such as signal amplification. In some applications, a single amplifier is connected to two or more application circuits. That is, the application circuits apply OP-sharing technique to drive the same amplifier to perform functions such as signal amplification. For example, two application circuits connect to a same amplifier. Input terminals of the amplifier are connected to a first application circuit and a second application circuit via a first switch. The amplifier is able to selectively connect to the first application circuit or the second application circuit through the first switch. On the other hand, the output terminals of the amplifier are connected to the first application circuit and the second application circuit via a second switch. Similarly, the amplifier can selectively connect to the first application circuit or the second application circuit through the second switch. The amplifier is utilized by either the first application circuit or the second application circuit during a same period.

In general, the first application circuit and the second application circuit do not drive the amplifier concurrently. Instead, the first application circuit and the second application circuit alternately drive the amplifier during different periods. The first application circuit drives the amplifier during the logical high state of a first clock signal, which is referred to as first working period, and the second application circuit drives the amplifier during the logical low state of a second clock signal, which is referred to as second working period. However, the output terminals usually have residual electric potential, which causes undesirable memory effect. As a result, if another application circuit needs to utilize the amplifier, a larger driving current is required to adjust the electric potential of the output terminals of the amplifier to a required level. As is well known in the art, larger current usually results in higher power loading of the system and increases the layout area.

SUMMARY OF THE INVENTION

It is therefore an objective of the present disclosure to provide circuits applying OP-sharing technique with a reset circuit and related methods thereof, to solve the above-mentioned problems.

An exemplary embodiment of a circuit applying OP-sharing technique is disclosed comprising: an amplifier; a first application circuit for driving the amplifier during at least a first working period; a second application circuit for driving the amplifier during at least a second working period; and a reset circuit for resetting the amplifier during at least a third working period in which the third working period is between the first working period and the second working period.

An exemplary embodiment of a method for operating a circuit applying OP-sharing technique is disclosed, wherein the circuit comprises an amplifier, a first application circuit, and a second application circuit. The proposed method comprises: controlling the first application circuit to drive the amplifier during at least a first working period; controlling the second application circuit to drive the amplifier during at least a second working period; and resetting the amplifier during at least a third working period in which the third working period is between the first working period and the second working period.

An exemplary embodiment of an OP-sharing circuit is disclosed. The OP-sharing circuit comprises: an amplifier; a first application circuit for utilizing the amplifier during at least one of a plurality of first working periods; a second application circuit for utilizing the amplifier during at least one of a plurality of second working periods; and a reset circuit for resetting the amplifier during at least one of a plurality of third working periods, wherein the third working period is between the first working period and the second working period.

An exemplary embodiment of an OP-sharing method is disclosed. The method comprises: controlling a first application circuit to utilize an amplifier during at least one of a plurality of first working periods; controlling a second application circuit to utilize the amplifier during at least a second working period; and resetting the amplifier during at least one of a plurality of third working periods, wherein the each third working period is between the first working period and the second working period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
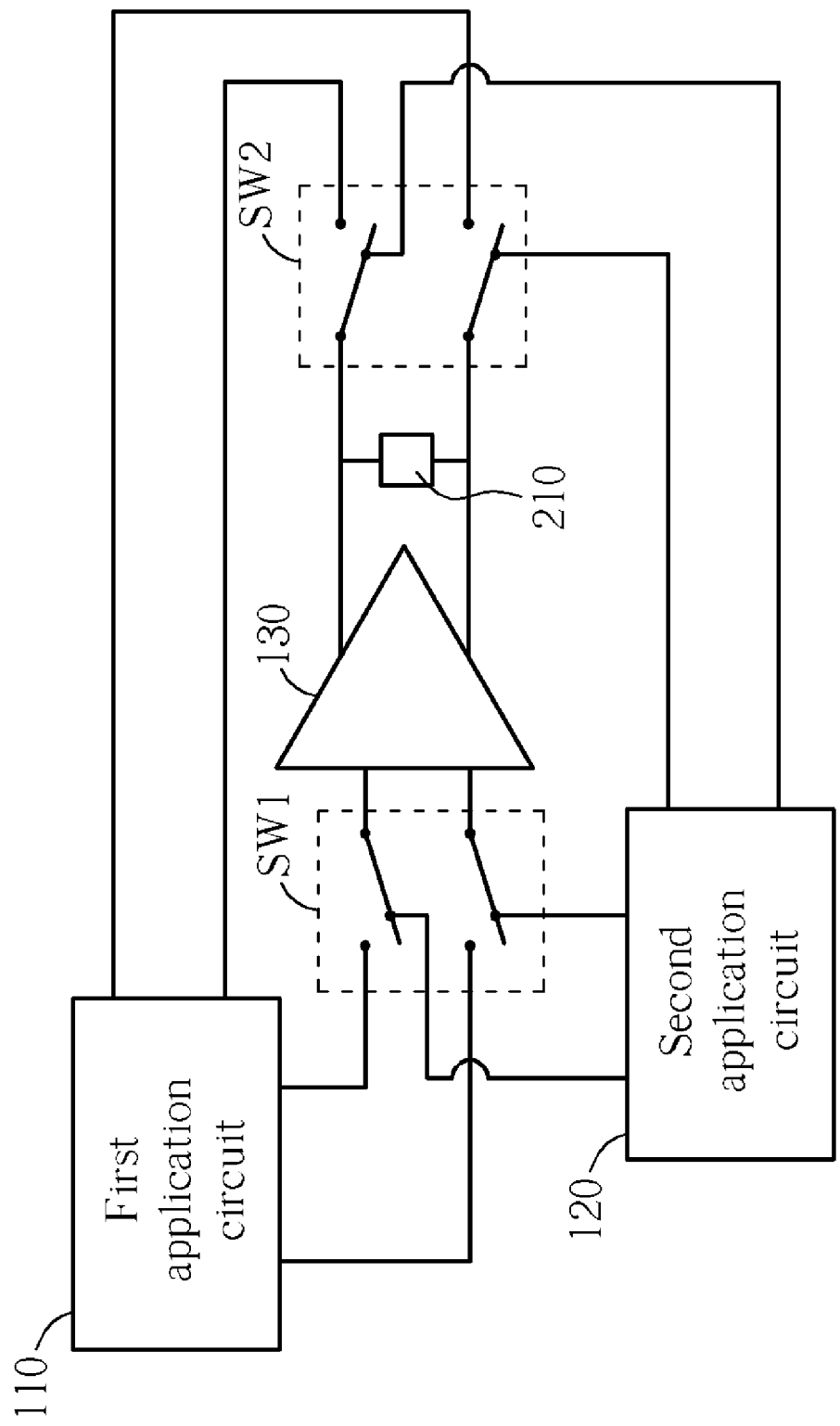
FIG. 1 is a circuitry diagram illustrating an amplifier with a reset circuit shared by a first application circuit and a second application circuit according to an exemplary embodiment of the present invention.
Figure 2:
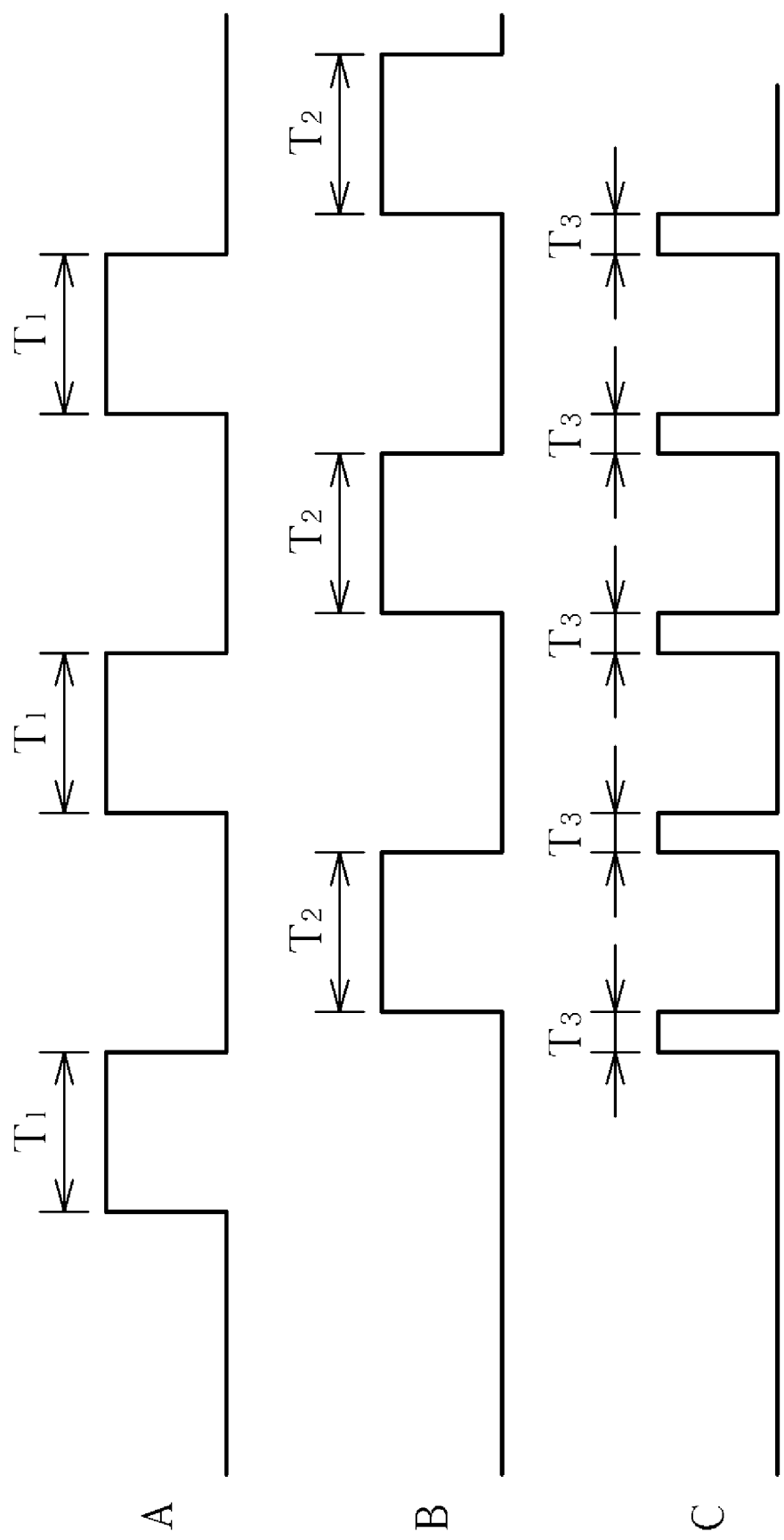
FIG. 2 is a timing diagram illustrating the amplifier of FIG. 1 driven by the first and second application circuits and reset by the reset circuit.

Please refer to FIG. 1, which shows an amplifier 130 with a reset circuit 210 shared by a first application circuit 110 and a second application circuit 120 according to an exemplary embodiment of the present invention. FIG. 2 is a timing diagram illustrating the relationship among a working clock signal A of the first application circuit 110, a working clock signal B of the second application circuit 120, and a working clock signal C of the reset circuit 210. As shown, at the time the amplifier 130 is switched from a first working period $T_1$ to a second working period $T_2$ or switched from the second working period $T_2$ to the first working period $T_1$, the working clock signal C controls the reset circuit 210 to reset the amplifier 130 during a third working period $T_3$. As a result, the output terminals of the amplifier 130 are reset to reduce the electric potential on the output terminals of the amplifier 130. Accordingly, the memory effect caused by the application circuit previously utilizing the amplifier 130 is alleviated. Therefore, there is no need to utilize a larger current to drive the output terminals of the amplifier 130 when another application circuit wants to drive the amplifier 130. In practice, the reset circuit 210 may be a switch controlled by the working clock signal C. For example, the reset circuit 210 can eliminate the memory effect by conducting the two output terminals of the amplifier 130 during the logic high state of the working clock signal C, i.e., the third working period $T_3$.

As in the foregoing descriptions, a reset circuit is arranged on the output terminal of the amplifier within the circuit applying OP-sharing technique. During the period at which the amplifier is not utilized by any application circuit, the reset circuit can be employed to eliminate the memory effect caused by the application circuit that previously drives the amplifier. If the amplifier is a differential amplifier, the reset circuit can be coupled to the two differential output terminals of the amplifier to reduce the residual electric potential between the two output terminals so as to minimize the memory effect. In practice, the amplifier is not limited to be periodically utilized by the two application circuits. That is, the first working period $T_1$ and the second working period $T_2$ may not be periodic. Similarly, the third working period $T_3$ for controlling the reset circuit may not periodic. Additionally, the reset circuit can reset the amplifier during any time gap at which the amplifier is not utilized by any application circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit applying OP-sharing technique, comprising:
   an amplifier;
   a first application circuit for driving the amplifier during at least a first working period;
   a second application circuit for driving the amplifier during at least a second working period; and
   a reset circuit for resetting the amplifier during at least a third working period, wherein the third working period is between the first working period and the second working period.

2. The circuit of claim 1, wherein the first and second application circuits alternately drive the amplifier during a plurality of first working periods and a plurality of second working periods.

3. The circuit of claim 1, wherein the amplifier is a differential amplifier.

4. The circuit of claim 3, wherein the reset circuit is a switch, for coupling one of the two differential output terminals of the amplifier to the other during each third working period.

5. A method for operating a circuit applying OP-sharing technique, the circuit comprises an amplifier, a first application circuit, and a second application circuit, the method comprising:
   controlling the first application circuit to drive the amplifier during at least a first working period;
   controlling the second application circuit to drive the amplifier during at least a second working period; and
   resetting the amplifier during at least a third working period, wherein the third working period is between the first working period and the second working period.

6. The method of claim 5, further comprising:
   controlling the first and second application circuits to alternately drive the amplifier during a plurality of first working periods and a plurality of second working periods.

7. The method of claim 5, wherein the amplifier is a differential amplifier.

8. The method of claim 7, wherein the resetting step conducts two differential output terminals of the amplifier during each third working period.

9. An OP-sharing circuit, comprising:
   an amplifier;
   a first application circuit for utilizing the amplifier during at least one of a plurality of first working periods;
   a second application circuit for utilizing the amplifier during at least one of a plurality of second working periods; and
   a reset circuit for resetting the amplifier during at least one of a plurality of third working periods, wherein the third working period is between the first working period and the second working period.

10. The circuit of claim 9, wherein the first and second application circuits alternately utilize the amplifier during the first working periods and the second working periods.

11. The circuit of claim 9, wherein the amplifier is a differential amplifier.

12. The circuit of claim 11, wherein the reset circuit is a switch, for coupling between two differential output terminals of the amplifier during the each third working period.

13. An OP-sharing method, the method comprising:
   controlling a first application circuit to utilize an amplifier during at least one of a plurality of first working periods;
   controlling a second application circuit to utilize the amplifier during at least a second working period; and
   resetting the amplifier during at least one of a plurality of third working periods, wherein the third working period is between the first working period and the second working period.

14. The method of claim 13, further comprising:
   controlling the first and second application circuits to alternately utilize the amplifier during the first working periods and the second working periods.

15. The method of claim 13, wherein the amplifier is a differential amplifier.

16. The method of claim 15, wherein the resetting step conducts two differential output terminals of the amplifier during each third working period.

* * * * *